(12) United States Patent
Gwehenberger

(10) Patent No.: US 9,527,179 B2
(45) Date of Patent: Dec. 27, 2016

(54) CAROUSEL CARRIER FOR A VACUUM TREATMENT INSTALLATION

(75) Inventor: Juergen Gwehenberger, Sevelen (CH)

(73) Assignee: OERLIKON SURFACE SOLUTIONS AG, PFAFFIKON, Pfaffikon SZ (CH)

(*) Notice: Subject to any disclaimer, the term of this patent is extended or adjusted under 35 U.S.C. 154(b) by 0 days.

(21) Appl. No.: 14/345,492

(22) PCT Filed: Aug. 29, 2012

(86) PCT No.: PCT/EP2012/003625
§ 371 (c)(1),
(2), (4) Date: May 9, 2014

(87) PCT Pub. No.: WO2013/041179
PCT Pub. Date: Mar. 28, 2013

(65) Prior Publication Data
US 2014/0346724 A1    Nov. 27, 2014

(30) Foreign Application Priority Data

Sep. 19, 2011    (DE) .................. 10 2011 113 563

(51) Int. Cl.
| B23Q 1/25 | (2006.01) |
| B23Q 7/02 | (2006.01) |
| C23C 14/50 | (2006.01) |
| C23C 16/458 | (2006.01) |
| B23Q 3/00 | (2006.01) |

(52) U.S. Cl.
CPC . B23Q 7/02 (2013.01); B23Q 3/00 (2013.01); C23C 14/505 (2013.01); C23C 16/4584 (2013.01); C23C 16/4585 (2013.01)

(58) Field of Classification Search
USPC ............................................. 269/55
See application file for complete search history.

(56) References Cited

U.S. PATENT DOCUMENTS

| 1,200,620 | A | * | 10/1916 | Johnson | ................ | F16H 3/34 |
|  |  |  |  |  |  | 74/354 |
| 1,363,906 | A | * | 12/1920 | Nilson | ................ | F16H 3/24 |
|  |  |  |  |  |  | 74/355 |
| 2,033,303 | A | * | 3/1936 | Ross | ................ | B23B 47/28 |
|  |  |  |  |  |  | 269/207 |
| 3,103,122 | A | * | 9/1963 | Reichelt | ................ | B65H 54/54 |
|  |  |  |  |  |  | 74/337 |
| 4,960,006 | A | * | 10/1990 | Moore | ................ | F01D 25/34 |
|  |  |  |  |  |  | 290/48 |

(Continued)

FOREIGN PATENT DOCUMENTS

| DE | 195 49 045 C1 | 6/1997 |
| EP | 2 348 139 A1 | 7/2011 |
| WO | 2007-025397 A1 | 3/2007 |

OTHER PUBLICATIONS

International Search Report for PCT/EP2012/003625 dated Feb. 7, 2013.

*Primary Examiner* — Alvin Grant
(74) *Attorney, Agent, or Firm* — Pearne & Gordon LLP

(57) ABSTRACT

A vacuum treatment installation having carousel carriers, in which the carousel drive is arranged on the wall that is located opposite the door of the vacuum treatment installation. In this way, the coupling of the carousel of the carousel carrier to the carousel drive is ensured without any further mechanism.

2 Claims, 4 Drawing Sheets

(56) References Cited

U.S. PATENT DOCUMENTS

| | | | | |
|---|---|---|---|---|
| 5,150,630 A * | 9/1992 | Kida | ........................ | F16H 3/40 |
| | | | | 74/354 |
| 5,497,844 A * | 3/1996 | Fritzinger | .............. | A63G 25/00 |
| | | | | 180/65.51 |
| 5,538,385 A * | 7/1996 | Bacchi | ............. | H01L 21/67775 |
| | | | | 414/403 |
| 5,762,873 A * | 6/1998 | Fanning | ................... | B01L 3/50 |
| | | | | 422/63 |
| 5,807,062 A | 9/1998 | Schultz et al. | | |
| 5,855,465 A * | 1/1999 | Boitnott | ........... | H01L 21/67745 |
| | | | | 204/298.25 |
| 6,454,519 B1 * | 9/2002 | Toshima | .......... | H01L 21/67201 |
| | | | | 118/500 |
| 7,409,263 B2 * | 8/2008 | Elliott | .............. | H01L 21/67379 |
| | | | | 700/213 |
| 9,095,888 B2 * | 8/2015 | Babbitt | ................. | B21D 51/26 |
| 2007/0137566 A1 * | 6/2007 | Cselle | .................. | C23C 14/325 |
| | | | | 118/715 |

* cited by examiner

CAROUSEL CARRIER FOR A VACUUM TREATMENT INSTALLATION

The present invention relates to a vacuum treatment installation with a workpiece holder, wherein the workpiece holder is executed as a carousel in such a fashion, that the workpieces to be treated are moved during the treatment process past treatment sources by rotating the carousel around its axis. The work pieces in this connection can be mounted on the carousel in such a manner that, during the rotation of the carousel, they perform a simple rotation or multiple rotations, i.e. for example double or triple rotations. According to the state of the art, the carousel is usually driven through its central axe.

Prior to the treatment of the workpieces in the vacuum treatment facility, the workpiece holder must be loaded with the workpieces. After the treatment, the workpieces must be removed from the workpiece holder. This can take place directly at the vacuum treatment installation. In order to simplify the loading and removal of workpieces, it is however known to install the carousel in the vacuum chamber in such a manner that, in order to load the workpieces and remove the treated workpieces, the whole carousel can be taken out of the vacuum chamber. This occurs for example by means of a forklift.

According to another approach known to the one skilled in the art, the carousel is placed on a base frame with wheels, so that it can be moved into the vacuum treatment installation by a vehicle approaching against the vacuum treatment installation. Hereinafter, such a carousel provided with wheels will be referred to as carousel carrier. The base frame of the carousel carrier is then fastened in the vacuum treatment facility and the central drive is coupled to the axle of the carousel. The disadvantage in this connection is that a complicated coupling mechanism is required for this, since the drive, on the one hand, should not stand in the way of moving the carousel into the vacuum treatment facility and, on the other hand, it must engage in the central axle of the carousel in order to drive it. One must bear in mind that the entire mechanism needs to be executed in a manner that is vacuum-compatible.

It would therefore be desirable to have at one's disposal a device with which a simple coupling of the carousel to the carousel drive can be achieved. This is the task that constitutes the basis for the present invention.

According to the invention, this aim is achieved by choosing not a central axle for the carousel but rather a drive over its periphery resp. over the carousel's perimeter. According to the invention, the drive is provided on the side opposite to the opening of the vacuum treatment installation and includes for example a gearwheel which, after the carousel carrier has been moved completely into the vacuum treatment installation, engages with a gear rim provided on the carousel perimeter, so that the gearwheel is capable of driving the carousel through the gear rim.

The invention will now be explained in detail on the basis of an example and with the aid of the figures.

According to a preferred embodiment of the present invention, rails are provided in the vacuum chamber in which the wheels can be made to roll in a guided fashion.

Figure 1:
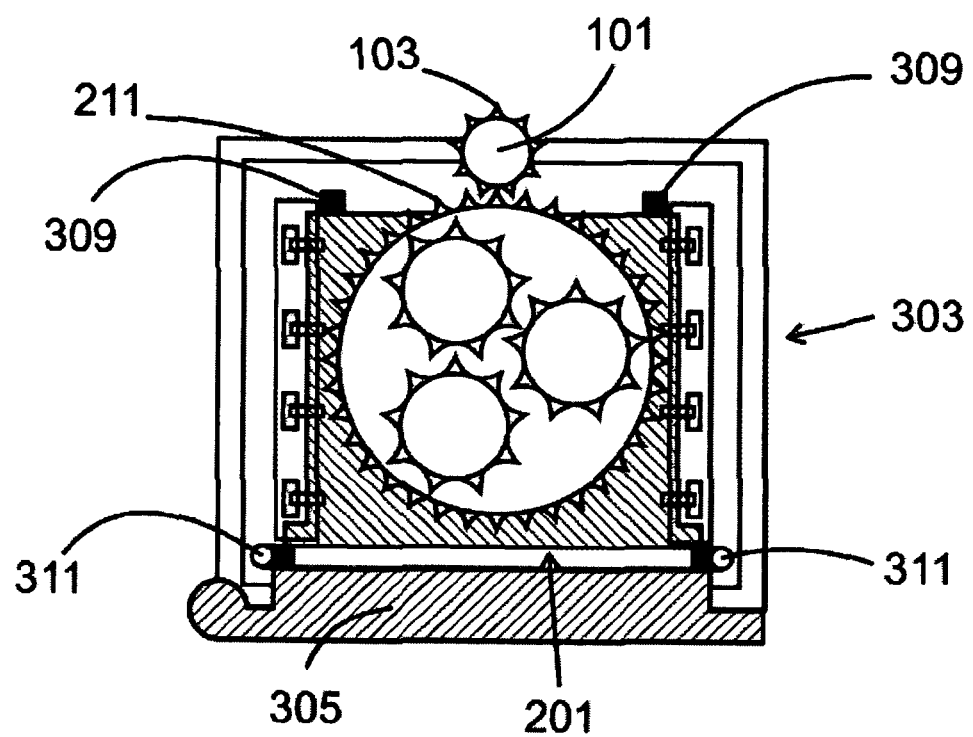
FIG. 1 shows in top view an inventive device with the carousel carrier being inserted and the door being closed.
Figure 2:
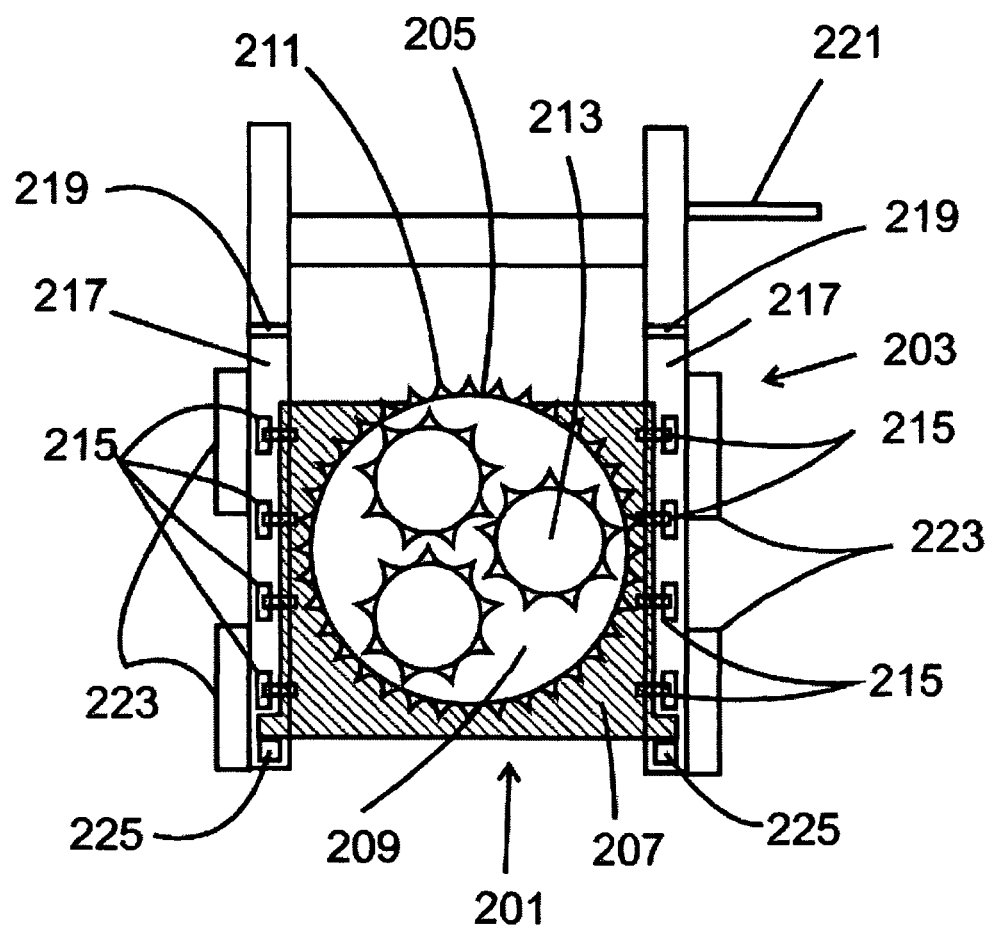
FIG. 2 shows in top view a carriage loaded with a carousel carrier.

FIG. 2 represents a carousel carrier 201 on a carriage 203. The carousel carrier 201 comprises a carousel 205 and a base frame 207. The carousel 205 comprises a turntable 209 with an outer gear rim 211 through which the carousel 205 can be driven. The carousel 205 according to the present embodiment further includes a gearwheel system 213 onto which is mounted the workpiece holder (not represented) for loading workpieces. The base frame 207 includes wheels 215 that are made of vacuum-compatible material. The wheels are preferably made of ceramic material, so that consequently, even if they are partly exposed to material coating during the coating process, they will fulfill their task for a long time without any maintenance.

Figure 3:
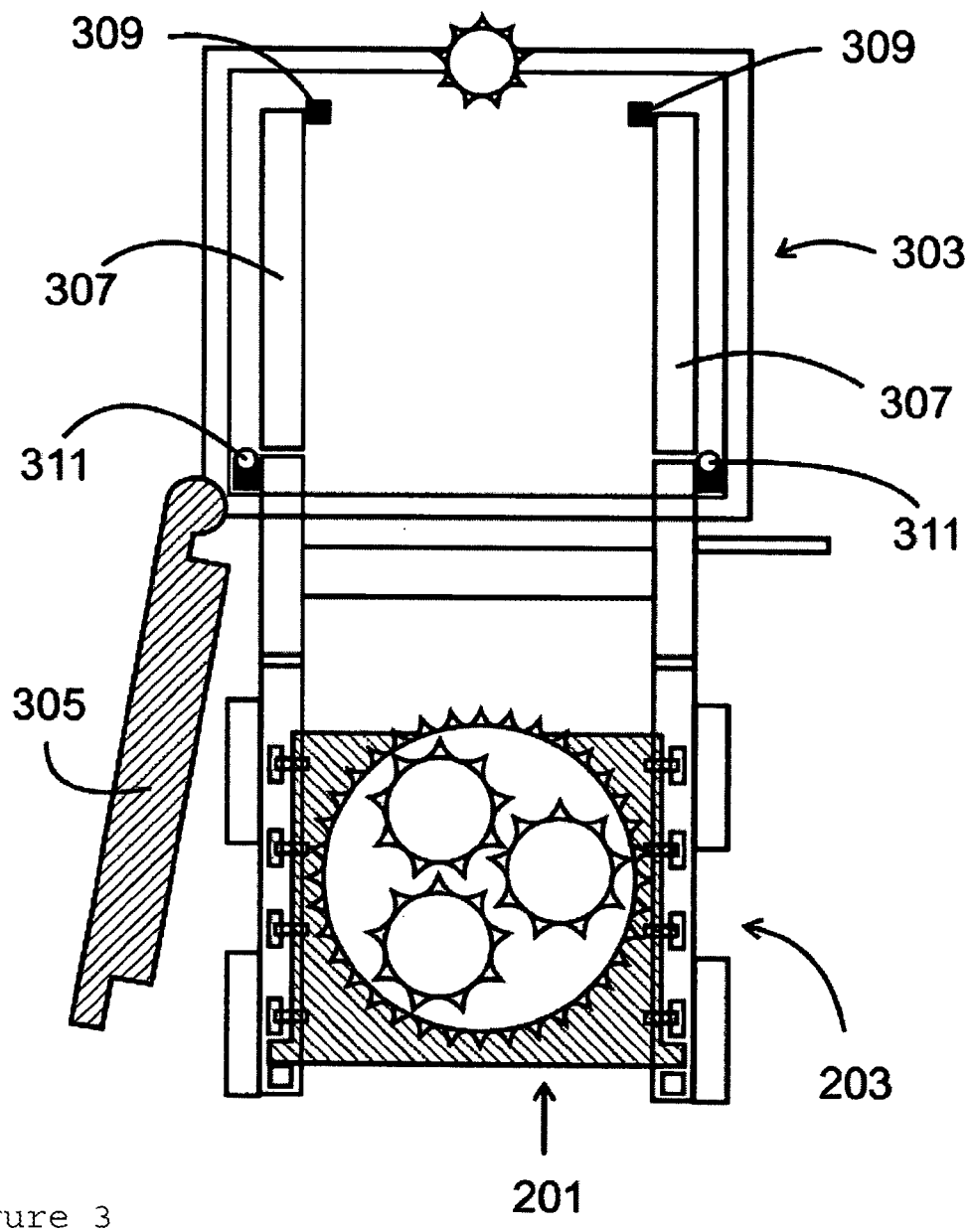
FIG. 3 shows the carriage represented in FIG. 2 that has been brought up to an open vacuum chamber.
Figure 4:
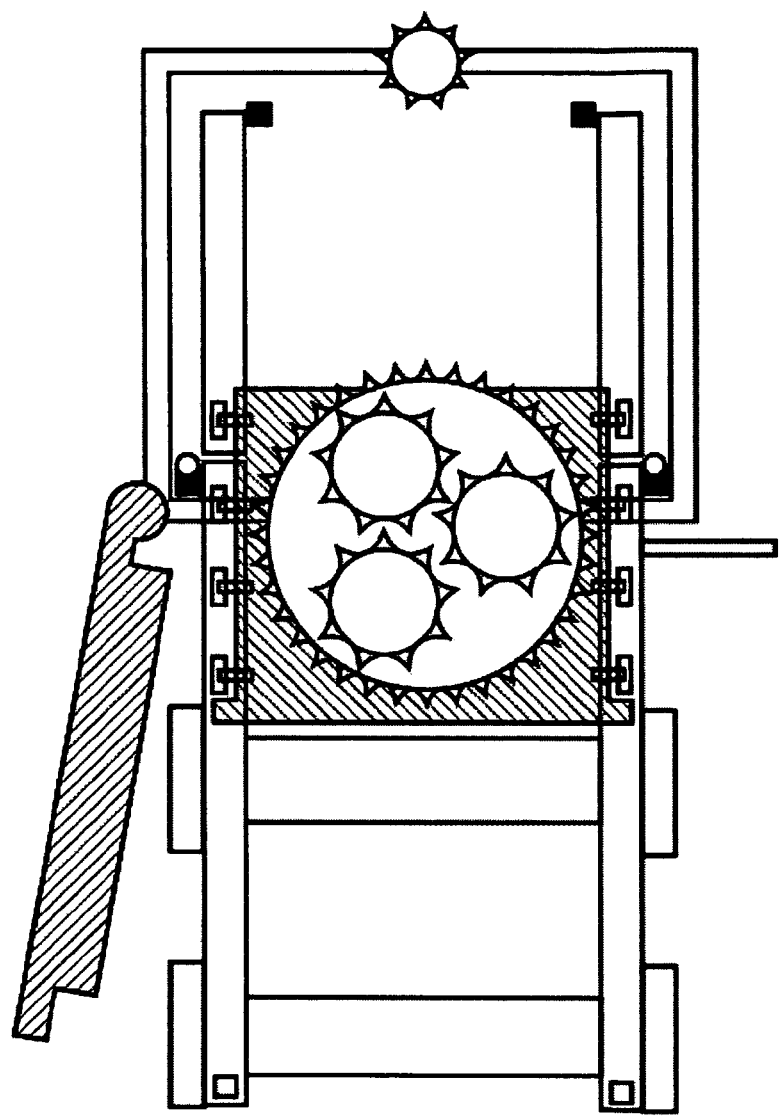
FIG. 4 shows the carousel carrier halfway into the vacuum chamber.

Two rails 217 are provided on the carriage 203, into which the wheels 215 of the carousel carrier can run. Both rails are interrupted each with a hinge 219 so that they can be folded upwards. A handle 221 is advantageously provided on the flap thus created, in order to operate the flap. Carriage stoppers 225 are provided at the other end of the rails 217. Wheels 223 are furthermore provided on the carriage, so that this carriage 203 can be brought up to a vacuum chamber in a simple way and manner. This is shown in FIG. 3. For the sake of greater clarity, some reference signs for the carriage 203 and the carousel carrier 203 have been omitted. The vacuum chamber 303 shown in FIG. 3 is shown with an opened door 305. The carriage 201 is brought to the vacuum chamber 303 in such a manner than with the flap folded down, the ends of the rails connect to the counterparts provided at the vacuum chamber, i.e. the vacuum chamber rails 307, so that the carousel carrier 201 can be moved into the vacuum chamber 303. The corresponding "driving in" is shown in FIG. 4. Rear stoppers 309 and front stoppers 311 are provided in the vacuum chamber. The front stoppers 311 are executed in a swiveling manner, so that they do not block the way when the carriage 203 is brought to the opened vacuum chamber 303 and when the carousel carrier 201 is inserted into the vacuum chamber 303. When the carousel carrier 201 has been completely moved into the vacuum chamber 303, the outer gear rim 211 of the carousel carrier engages in the gear rim 103 of the gear rim 103 of the carousel drive 101 provided on the wall opposite the door 305. The stoppers 309 ensure that the gear rim 103 of the carousel drive 101 and the gear rim 211 of the carousel 205 do not engage too deeply with one another. In order to close the vacuum chamber 303, the two front stoppers 311 are then swiveled inwards and the door 305 is closed. When the door 305 is closed, its pressure on the front stoppers 311 ensures that the latter press against the carousel carrier so that the gear rim 103 of the carousel drive 101 and the gear rim 211 of the carousel 205 engage sufficiently deeply with one another. According to this embodiment, the interaction of door 305, front stoppers 311, carousel carrier 201 and rear stoppers 309 thus ensure the gear rim 103 of the carousel drive 101 and the gear rim 211 of the carousel 205 are operatively connected in an optimum fashion to be able to drive the carousel.

The vacuum chamber (303) of the vacuum treatment facility can then be pumped out, the carousel drive 101 switched on and the vacuum treatment operation performed.

The vacuum treatment installation can be for example a coating facility. This can be for example a facility for the physical and/or chemical deposition from the gas phase (PVD and/or CVD). It can however also (possibly additionally) be an etching facility, for example for cleaning and/or activating surfaces. The present invention makes the loading and unloading prior to resp. after the treatment process considerably easier as compared with the state of the art. A particular advantage is afforded by the embodiment wherein the carousel and the carousel drive are coupled to one another in a simple manner and without additional mechanisms.

What is claimed is:

1. Vacuum treatment installation with a vacuum chamber (303) and a carousel carrier (201) with a carousel (205), wherein the vacuum chamber (303) has a door (305) and a carousel drive (101), characterized in that the carousel drive (101) is a peripheral drive which is provided on an inner wall of the vacuum chamber (303) opposite the door (305), characterized in that in the vacuum chamber (303) at least one rear stopper (309) and at least one front stopper (311) are provided which ensure that when the carousel carrier (201) is fully inserted into the vacuum chamber (303) and the door (305) is closed, the carousel drive (101) is operably connected with the carousel (205) and ready for operation, and characterized in that the carousel drive (101) has a gear rim (103) and the carousel (205) has an outer gear rim (207) so that when the carousel carrier (201) is fully inserted into the vacuum chamber (303) and the door (205) is closed, the gear rim (103) of the carousel drive engages in the outer gear rim (207) of the carousel (205).

2. Vacuum treatment installation with a vacuum chamber (303) and a carousel carrier (201) with a carousel (205), wherein the vacuum chamber (303) has a door (305) and a carousel drive (101), characterized in that the carousel drive (101) is a peripheral drive which is provided on an inner wall of the vacuum chamber (303) opposite the door (305), characterized in that in the vacuum chamber (303) at least one rear stopper (309) and at least one front stopper (311) are provided which ensure that when the carousel carrier (201) is fully inserted into the vacuum chamber (303) and the door (305) is closed, the carousel drive (101) is operably connected with the carousel (205) and ready for operation, and characterized in that the at least one front stopper (311) is designed in a movable, preferably swiveling fashion so that the at least one front stopper (311) can be swiveled out of the way when the carousel carrier (201) is inserted and at least one front stopper (311) can be placed between the door (305) and the carousel carrier (201) when the door (205) is closed, so that the carousel carrier (201) is fastened in the vacuum chamber (303).

* * * * *